United States Patent [19]

Tsuchimoto

[11] Patent Number: 4,920,516
[45] Date of Patent: Apr. 24, 1990

[54] READ ONLY MEMORY CIRCUIT HAVING A PRECHARGED SELECTED BIT LINE

[75] Inventor: Yuji Tsuchimoto, Kawasaki, Japan

[73] Assignee: Fujitsu Limited, Kawasaki, Japan

[21] Appl. No.: 190,447

[22] Filed: May 5, 1988

[30] Foreign Application Priority Data

May 12, 1987 [JP] Japan .................. 62-115314

[51] Int. Cl.$^5$ .............................................. G11C 13/00
[52] U.S. Cl. .................. 365/203; 365/189.09; 365/175; 365/207
[58] Field of Search .............. 365/189.01, 189.09, 365/230.01, 105, 115, 175, 203, 207, 243

[56] References Cited

U.S. PATENT DOCUMENTS

| 4,727,517 | 2/1988 | Ueno et al. | 365/208 |
| 4,800,529 | 1/1989 | Ueno | 365/189 |
| 4,819,212 | 4/1989 | Nakai et al. | 365/230 |

Primary Examiner—Terrell W. Fears
Attorney, Agent, or Firm—Armstrong, Nikaido, Marmelstein, Kubovcik & Murray

[57] ABSTRACT

A read only memory circuit comprises bit lines, word lines and cells connected between the bit lines and word lines. The read only memory circuit also comprises a discharge circuit. The discharge circuit is used for discharging all the bit lines except for one of the bit lines designated in order to read out a datum stored in a cell connected to the designated one bit line.

18 Claims, 8 Drawing Sheets

READ ONLY MEMORY CIRCUIT HAVING A PRECHARGED SELECTED BIT LINE

BACKGROUND OF THE INVENTION

The present invention generally relates to a read only memory circuit, and in particular to a read only memory circuit in which information stored in a cell designated by an X address and a Y address is read out by precharging a bit line designated by the Y address and selecting a word line designated by the X address.

A read only memory (hereafter simply referred to as a ROM) circuit has been widely used in various electronic circuits. In general, a ROM circuit comprises a memory cell array composed of a number of cells, bit lines and word lines. When reading out information stored in a cell, a read address consisting of an X address and a Y address is provided with the ROM. One bit line designated by the supplied Y address is precharged to a predetermined potential (precharge potential). In this state, it is discriminated whether or not the designated bit line and one word line designated by the X address have been electrically coupled with each other by the diode connected therebetween in the forward direction, in other words it is discriminated whether or not the designated bit line is discharged by the designated word line via the diode. When the bit line is discharged and therefore its potential is changed to a predetermined discharge potential, it can be found that information has already been written in the cell, i.e., the cell is in a written state. Alternatively, when information has not been written in the cell, the bit line is not allowed to be discharged. That is, the bit line is maintained at the precharged potential. In the latter case, it may be considered that there is virtually no diode for making electrical contact between the designated bit line and the designated word line. In this manner, information stored in each of cells can be read out. This holds true for a programmable read only memory (hereafter referred to as a PROM).

However, the conventional ROM circuit has a disadvantage arising from an address skew. Each of the X and Y addresses is composed of a plurality of bits. The address skew causes some of the bits supplied to the ROM circuit to be delayed. When the address skew occurs, some cells in which information have already been written conduct transitionally or in an instance, and thereby charges are accumulated in semiconductor layers forming the cells. The charges accumulated in the semiconductor layers of the cells have a function of decreasing the speed in which information is read out therefrom.

SUMMARY OF THE INVENTION

Accordingly, a general object of the present invention is to provide a novel and useful read only memory in which the above disadvantage has been eliminated.

A more specific object of the present invention is to provide a read only memory capable of reading out information from a cell at a high speed.

Another object of the present invention is to provide a read only memory circuit in which charges are prevented from being accumulated in semiconductor layers of cells which conduct transitionally due to the occurrence of the address skew.

The above objects of the present invention are achieved by a read only memory comprising a memory cell array comprising a plurality of bit lines, a plurality of word lines and cells connected between the bit lines and word lines; a bit line selecting circuit for selecting one of the bit lines designated by a Y address and precharging the selected bit line at a precharged potential; a word line selecting circuit for selecting one of the word lines by an X address; a signal output circuit for extracting a datum stored in one cell connected between said one bit line and said one word line designated by the supply of the X and Y addresses; and a discharge circuit for discharging all the bit lines except for said one bit line designated by the Y address.

In another aspect of the present invention, in place of the above discharge circuit, a discharge circuit for discharging a part of all the discharge lines except for said one bit line designated by the Y address.

Other objects, features and advantages of the present invention will become apparent from the following detailed description when read in conjunction with the accompanying drawings.

DETAILED DESCRIPTION

In order to facilitate the understanding of the present invention, a description is now given of a conventional read only memory circuit, by referring to FIGS. 1 through 5.

Figure 1:
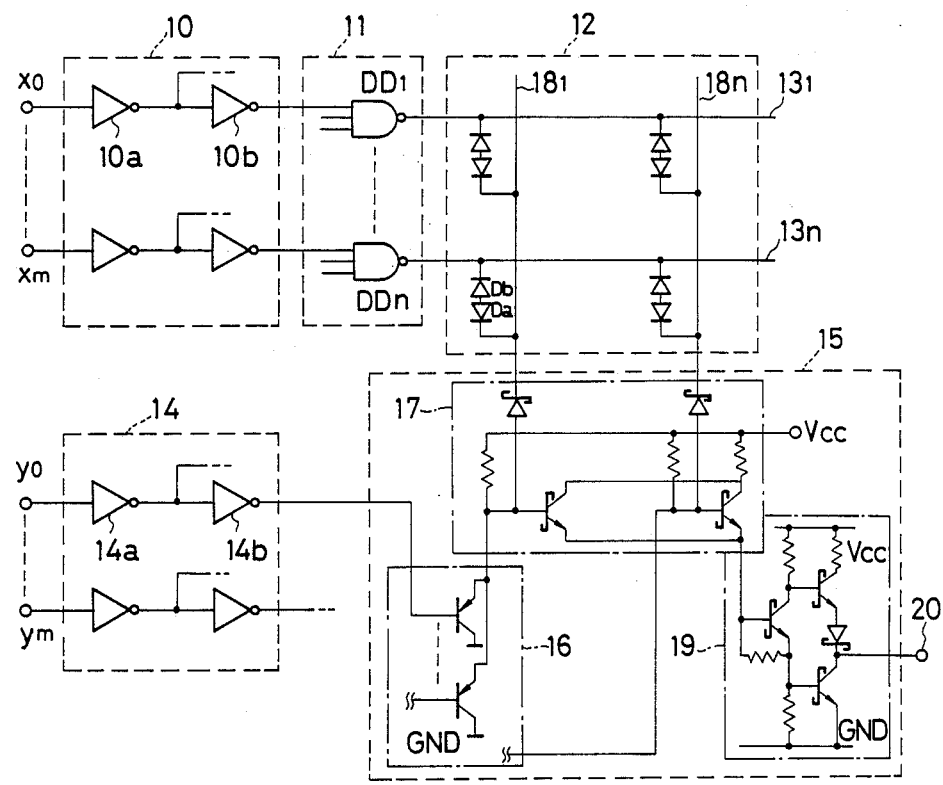
FIG. 1 is a circuit diagram of a conventional ROM circuit.

FIG. 1 is a circuit diagram of a conventional PROM circuit which is one of variations of ROM circuits. An X address circuit 10 is provided with address bits $x_0$ to $x_m$. The X address circuit 10 comprises two series-connected inverters 10a and 10b for each address bit. Output signals of the two inverters 10a and 10b for each address bit are supplied to a decoder/driver circuit 11. That is, the decoder/driver circuit 11 receives the address bits $x_0$ to $x_m$ and inverted address bits thereof. The decoder/driver circuit 11 is made up of a plurality of NAND circuits $DD_1$ to $DD_n$. For simplicity, only one of inputs of the NAND circuit $DD_1$ is shown and the others are omitted. Output terminals of the NAND circuits $DD_1$ to $DD_n$ are connected to word lines $13_1$ to $13_n$ of a memory cell array 12, respectively.

A Y address circuit 14 is provided with address bits $y_0$ to $y_m$. The Y address circuit 14 comprises two series-connected inverters 14a and 14b for each address bit. The address bits $y_0$ to $y_m$ and inverted address bits thereof are supplied to a decoder/driver circuit 16 provided in an output multiplexing circuit 15. The decoder/driver circuit 16 comprises transistors, gate terminals of which receive corresponding address bits from the Y address circuit 14. Outputs of the decoder/driver circuit 16 are supplied to a multiplex circuit 17, which comprises Schottky transistors. Gate terminals of the Schottky transistors are connected to emitter terminals of related transistors in the decor/driver circuit 16. The gate terminals of the Schottky transistors in the multiplex circuit 17 are also connected to related bit lines $18_1$ to $18_n$ of the memory cell array 12. Collector terminals of the Schottky transistors in the multiplex circuit 17 are supplied with a positive power Vcc through respective resistors. All the emitter terminals of the transistors in the multiplex circuit 17 are connected to an input terminal of an output circuit 19. A datum stored in one cell designated by the addresses $x_0$ to $x_m$ and $y_0$ to $y_m$ is read out therefrom and is supplied to an output circuit 19 through the multiplex circuit 17. The output circuit 19 outputs the datum read out at a terminal 20. As illustrated, the output circuit 19 comprises Schottky transistors.

Figure 3A:
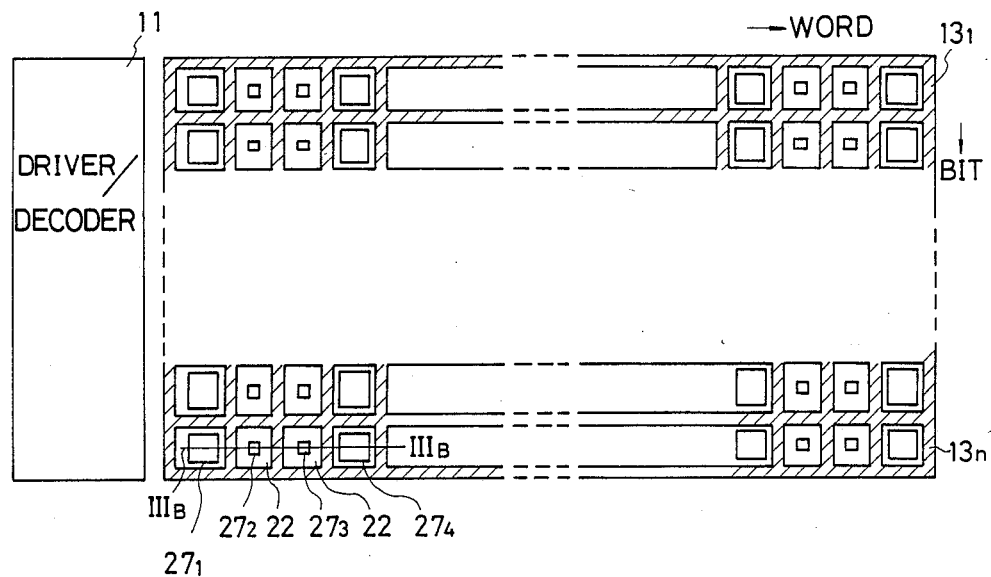
FIG. 3A is a plan view of an integrated circuit device where the circuit shown in FIG. 1 is implemented.
Figure 3B:
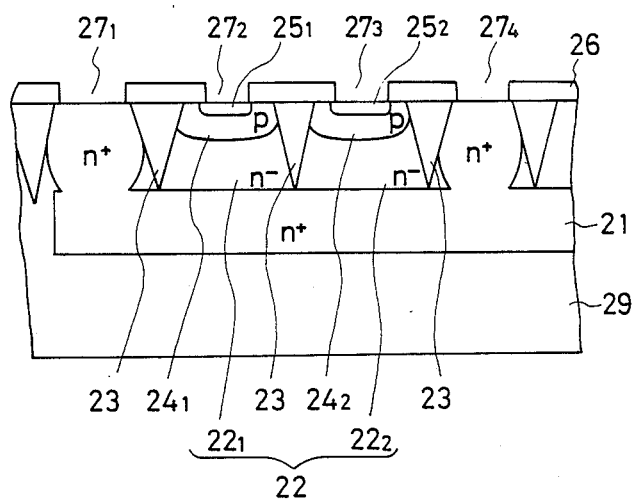
FIG. 3B is an cross sectional view taken along a line $III_B$—$III_B$ shown in FIG. 3A.
Figure 4:
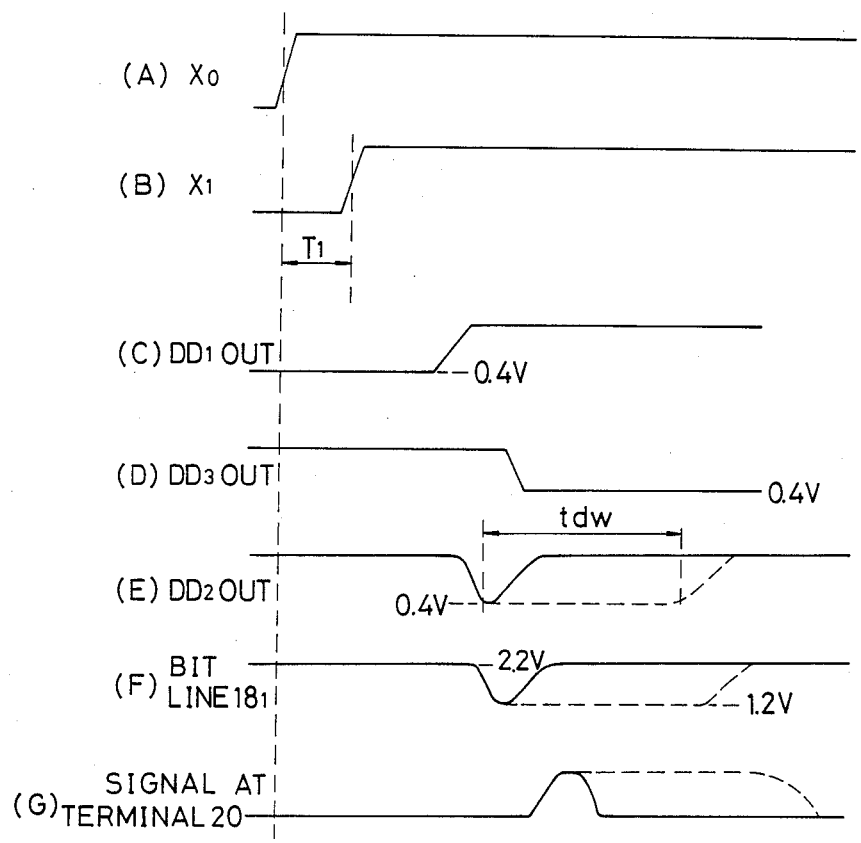
FIGS. 4(A) through 4(G) show signal waveforms at different parts in the circuits shown in FIGS. 1 and 2.

FIG. 3A is a plan view of the PROM circuit shown in FIG. 1, and FIG. 3B is a cross sectional view taken along a line $III_B$—$III_B$ shown in FIG. 3A. The line $III_B$—$III_B$ corresponds to the word line $13_n$ shown in FIG. 1. In the illustrated example, each cell is formed in an $n^+$-type semiconductor layer 21 formed in a substrate 29. An $n^-$-type epitaxial layer 22 is formed in the $n^+$-type layer 21. V-shaped groove isolations 23 are formed in the $n^-$-type epitaxial layer 22 so as to divide the layer 22 into two parts $22_1$ and $22_2$. The V-shaped groove isolations 23 are formed by filling insulation into V-shaped grooves formed in $n^-$-epitaxial layer 22. $N^-$-type layer parts $22_1$ and $22_2$ separated by the V-shaped groove isolations 23 comprise p-type diffusion layers $24_1$ and $24_2$, respectively. $N^+$-type diffusion layers $25_1$ and $25_2$ are formed in the p-type diffusion layers $24_1$ and $24_2$, respectively. As shown in FIG. 1, all the cells connected to the word line $13_n$ are in the unwritten state. Therefore, each cell connected to the word line $13_n$ has the $n^+$-diffusion layers such as $25_1$ and $25_2$. The combination of the $n^+$-type diffusion layer 25 and the p-type diffusion layer 24 forms a diode Da shown in FIG. 1, and the combination of the p-type diffusion layer 24 and the $n^-$-type epitaxial layer 22 forms a diode Db. When a datum is written in the cell $S_{n1}$ for example, a reverse bias voltage is applied to the junction of the $n^+$-type diffusion layer $25_1$ and the p-type diffusion layer $24_1$, and thereby the $n^+$-type layer $25_1$ is destroyed. An insulating film 26 such as $SiO_2$ is deposited on top of the substrate 29 as shown in FIGS. 3A and 3B. The insulating film 26 has a plurality of contact holes $27_1$, $27_2$, $27_3$ and $27_4$. Metallization films (not shown) forming bit lines $18_1$ and $18_2$ are provided so as to cover the contact holes $27_2$ and $27_3$, and a metallization film forming the word line $13_n$ is provided so as to cover the contact holes $27_1$ and $27_4$.

Figure 2:
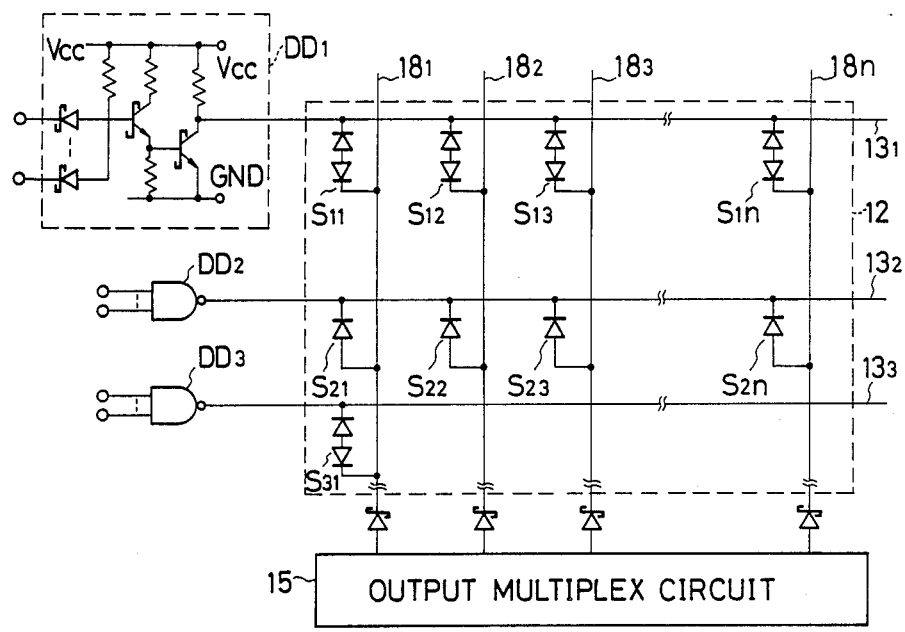
FIG. 2 is a circuit diagram of a portion of the circuit configuration shown in FIG. 1.

As shown in FIG. 2, it is assumed that no data has been written in any the cells $S_{11}$ to $S_{1n}$ connected to the word line $13_1$ in the memory cell array 12 shown in FIG. 1, and data have been written in all the cells $S_{21}$ to $S_{2n}$ connected to the word line $13_2$. When the cell $S_{11}$ is selected, the bit line $18_1$ is charged up to a high level of the potential (approximately 2.2 volts, for example; hereafter simply referred to a H-level), because a datum has not been written in the cell $S_{11}$ and therefore the current is not allowed to pass through the cell $S_{11}$. Subsequently, when the cell $S_{12}$ is selected, the bit line $18_2$ is charged up to the H-level, because a datum has not been written therein. At this time, the bit line $18_1$ is maintained in the charged-up state, or at the H-level. When the cells $S_{13}$ to $S_{1n}$ are sequentially selected in the same way, the bit lines $18_3$ to $18_n$ are switched to and maintained at the H-levels.

Thereafter, it is assumed that values of the address bits $x_0$ to $x_m$ are changed and the cell $S_{31}$ is selected by setting both the address bits $x_0$ and $x_1$ to '1'. These changes to the values of the address bits $x_0$ and $x_1$ are illustrated in FIGS. 4(A) and 4(B). As can be seen from these figures, the rise of the signal waveform of the address bit $x_1$ lags that of the signal waveform of the address bit $x_0$ by a time $T_1$. Such a phenomenon is called the address skew as described before, and the delay time $T_1$ is called an address skew time. The occurrence of the address skew is an inevitable problem in the practical use of the ROM. The address skew occurring on the address bit $x_1$ causes the potential of the output signal of the NAND circuit $DD_2$ to temporarily become a low-level (approximately 0.4 volts, for example; hereafter simply referred to as a L-level). Thereby, the cells $S_{21}$ to $S_{2n}$ in which the data have already been written conduct transitionally or in an instant. That is, currents are passed through the cells $S_{21}$ to $S_{2n}$ from the bit lines $18_1$ to $18_n$ which are kept at the precharged state. Signal waveforms obtained at the output terminals of the NAND circuits $DD_1$ and $DD_3$ are shown in FIGS. 4(C) and 4(D), respectively.

Figure 5:
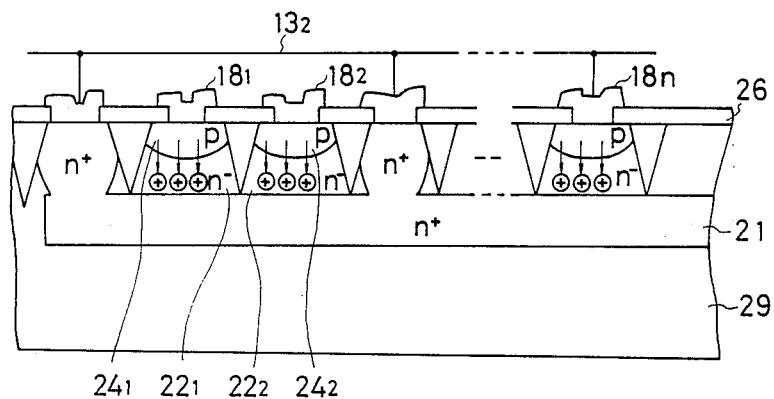
FIG. 5 is a cross sectional view of the integrated circuit device of FIG. 3A for explaining accumulation of carriers due to the address skew.

During the time when the cells $S_{21}$ to $S_{2n}$ conduct transitionally due to the address skew, as shown in FIG. 5, a number of minority carriers, i.e., electrons in this example are accumulated in the $n^-$-type epitaxial layer 22 of each of the cells $S_{21}$ to $S_{2n}$. Thereafter, when the word line $13_2$ is selected, it is precharged up to the H-level. In this case, the accumulated minority carriers must be cancelled in order that the word line $13_2$ reaches the H-level. Therefore, as shown by a broken line in FIG. 4(E), the rise of the signal waveform at the output of the NAND circuit $DD_2$ is delayed by a time tdw. Correspondingly, the rise of the signal waveform at the bit line $18_1$ is delayed as shown by a broken line in FIG. 4(F), and the decrease of the signal waveform at the terminal 20 is delayed as shown in FIG. 4(G). If the data have been written in a part of the cells $S_{21}$ to $S_{2n}$ and the remaining cells are in the unwritten state, the signal waveforms will be changed as indicated by the solid lines in FIGS. 4(E) through 4(G). That is, the solid lines show signal waveforms obtained in the case where a smaller number of the cells conducts transitionally due to the address skew. As can be seen from FIGS. 4(E) through 4(G), the speed in which the datum is read out from the cell decreases as the number of the cells which conduct temporarily due to the address skew is increased.

The present invention intends to eliminate the above problem.

A description is given of a preferred embodiment of the present invention with reference to FIGS. 6 through 9.

Figure 6:
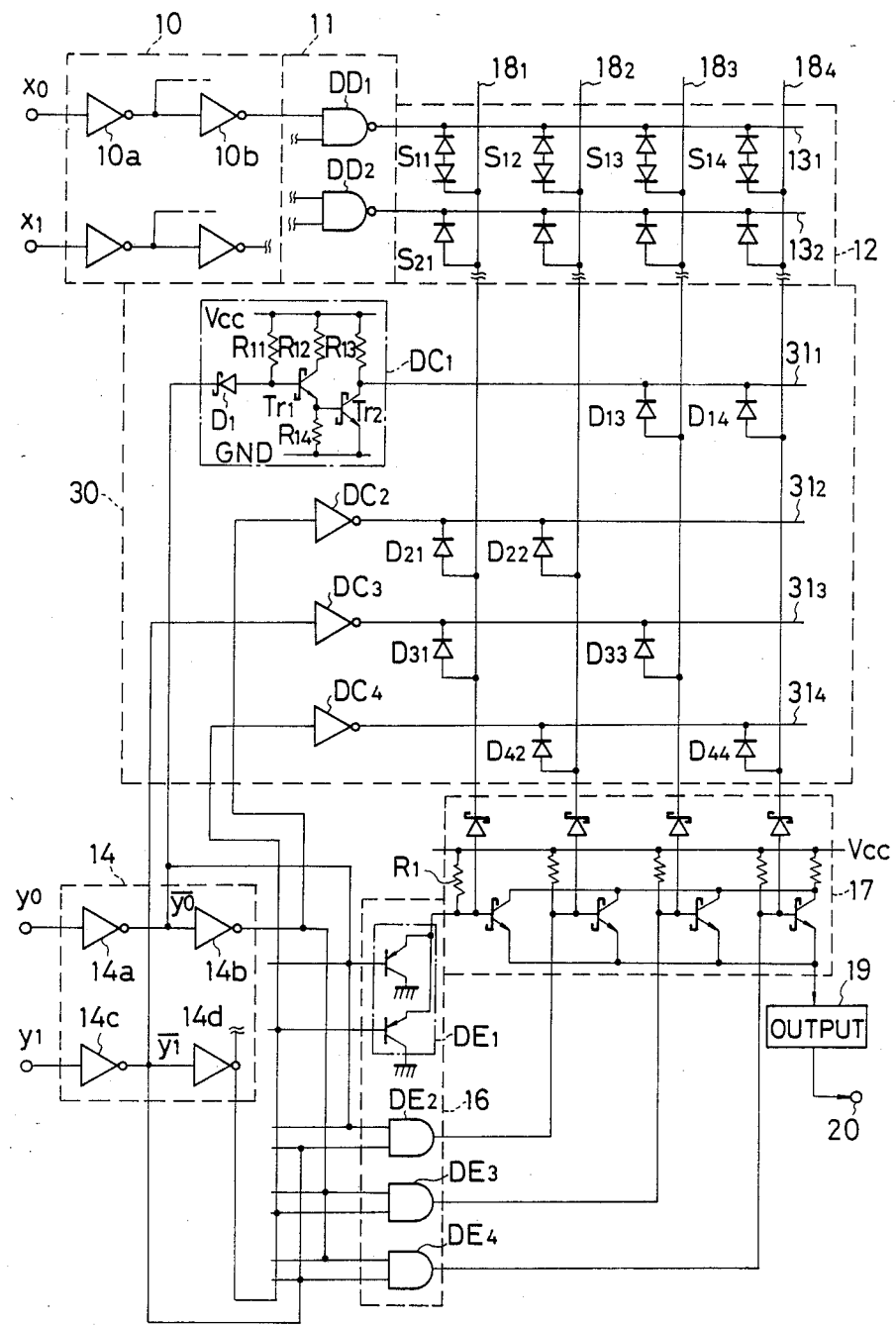
FIG. 6 is a circuit diagram of a preferred embodiment of the present invention.

The illustrated embodiment is a PROM circuit. In FIG. 6, the same constituents as those in the previous figures are denoted by the same reference numerals as those therein. The X address circuit 10 is provided with the address bits $x_0$ to $x_m$, and the Y address circuit 14 is provided with the address bits $y_0$ to $y_m$. In FIG. 6, an example is illustrated where $m=1$ for simplicity. That is, the address of the ROM circuit consists of the address bits $x_0$ and $x_1$, and the address bits $y_0$ and $y_1$. An output signal $\overline{y}_0$ of the inverter 14a to which the address bit $y_0$ is applied is supplied not only to AND circuits $DE_1$ and $DE_2$ provided in the decoder/driver circuit 16 but also to an inverter $DC_1$ provided in a discharge circuit 30. An output signal $y_0$ of the inverter 14b which receives the output signal of the inverter 14a is supplied not only to AND circuits $DE_3$ and $DE_4$ but also to an inverter $DC_2$ in the discharge circuit 30. An output signal $\overline{Y}_1$ of an inverter 14c to which the address bit $y_1$ is applied is supplied not only to the AND circuits $DE_2$ and $DE_4$ in the decoder/driver circuit 16 but also to an inverter $DC_3$ in the discharge circuit 30. An output signal $y_1$ of an inverter 14d which receives the output signal of the inverter 14c is supplied not only to the AND circuits $DE_1$ and $DE_3$ but also to an inverter $DC_4$ in the discharge circuit 30. Each of the AND circuits $DE_1$ to $DE_4$ is composed of two transistors as shown.

Each of the inverters $DC_1$ to $DC_4$ is composed of two Schottky transistors $Tr_1$ and $Tr_2$, resistors $R_{11}$ through $R_{14}$ and a Schottky diode $D_1$. A cathode terminal of the Schottky diode $D_1$ is the input terminal of the inverter $DC_1$, and a collector terminal of the transistor $Tr_2$ is the output terminal thereof. Base and collector terminals of the transistor $Tr_1$ and the collector terminal of the transistor $Tr_2$ are provided with a positive power supply potential Vcc through the resistors $R_{11}$, $R_{12}$ and $R_{13}$, respectively. An emitter terminal of the transistor $Tr_1$ and a base terminal of the transistor $Tr_2$ are connected to the ground via the resistor $R_{14}$. An emitter terminal of the transistor $Tr_2$ is directly connected to the ground.

The discharge circuit 30 has discharge lines $31_1$ to $31_4$ which are connected to output terminals of the respective inverters $DC_1$ to $DC_4$, respectively. The discharge lines $31_1$ to $31_4$ extend from the inverters $DC_1$ to $DC_4$ to the bit line $18_4$ via the bit lines $18_1$ to $18_3$. The bit lines $18_3$ and $18_4$ are connected to the discharge line $31_1$ via diodes $D_{13}$ and $D_{14}$. The bit lines $18_1$ and $18_2$ are connected to the discharge line $31_2$ via the diodes $D_{21}$ and $D_{22}$. The bit lines $18_1$ and $18_3$ are connected to the discharge line $31_3$ via diodes $D_{31}$ and $D_{33}$. The bit lines $18_2$ and $18_4$ are connected to the discharge line $31_4$ via diodes $D_{42}$ and $D_{44}$.

Positions at which diodes in the discharge circuit 30 are to be connected between discharge lines and bit lines are decided as follows. When the input of the inverter $DC_1$ is at the H-level, the bit lines $18_1$ and $18_2$ have probability of being selected and precharged. This is because the H-level signal supplied to the inverter $DC_1$ is also supplied to the AND circuits $DE_1$ and $DE_2$. In this case, diodes are not provided between the discharge line $31_1$ and each of the bit lines $18_1$ and $18_2$, and are connected between the discharge line $31_1$ and each of the bit lines $18_3$ and $18_4$. When the input signal of the inverter $DC_2$ is at the H-level, the bit lines $18_3$ and $18_4$ has a probability of being selected. Therefore, diodes are not provided between the discharge line $31_2$ and each of the bit lines $18_3$ and $18_4$, and are connected between the discharge line $31_2$ and each of the bit lines $18_1$ and $18_2$.

Figure 7A:
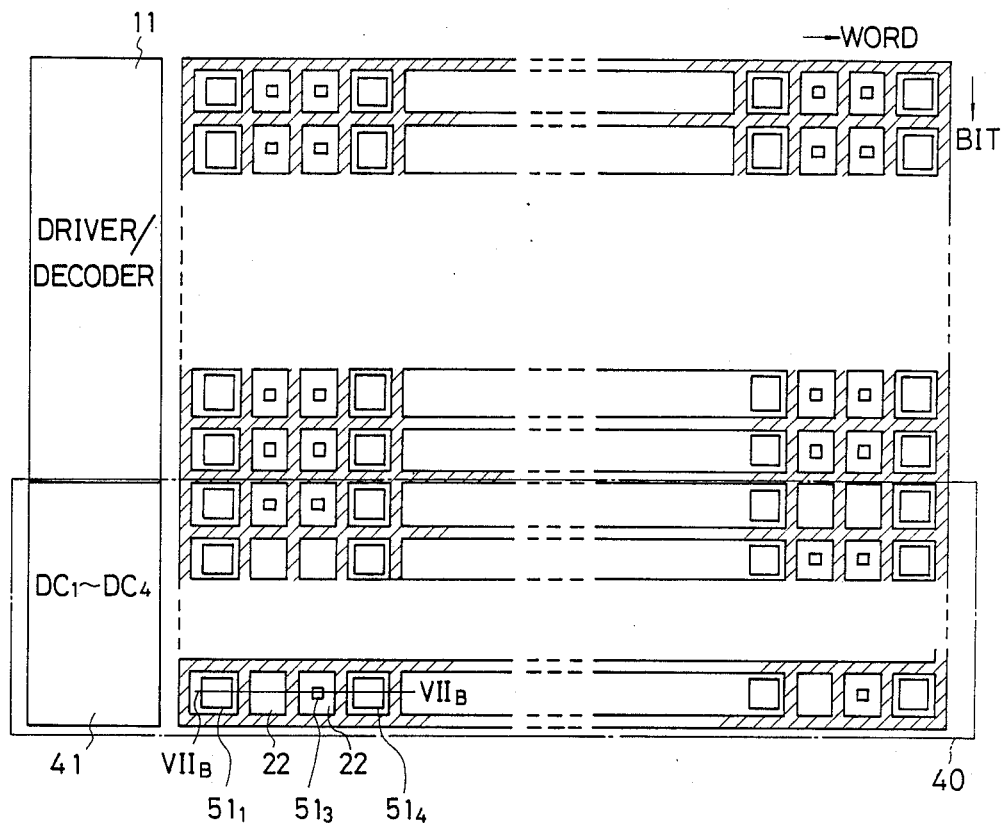
FIG. 7A is a plan view of an integrated circuit device where the circuit shown in FIG. 6 is implemented.
Figure 7B:
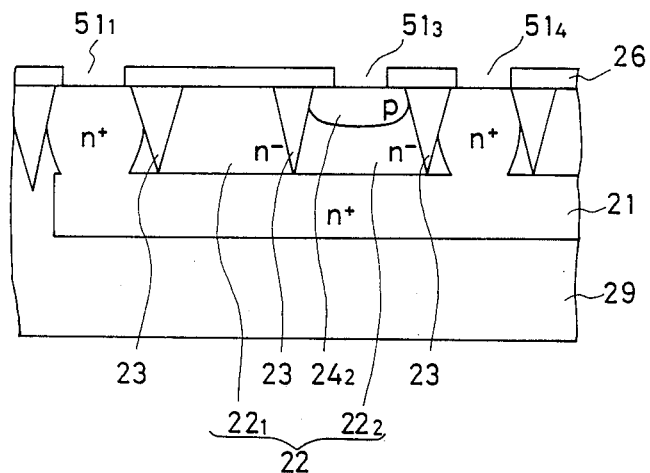
FIG. 7B is a cross sectional view taken along a line $VII_B$—$VII_B$ shown in FIG. 7A.
Figure 8:
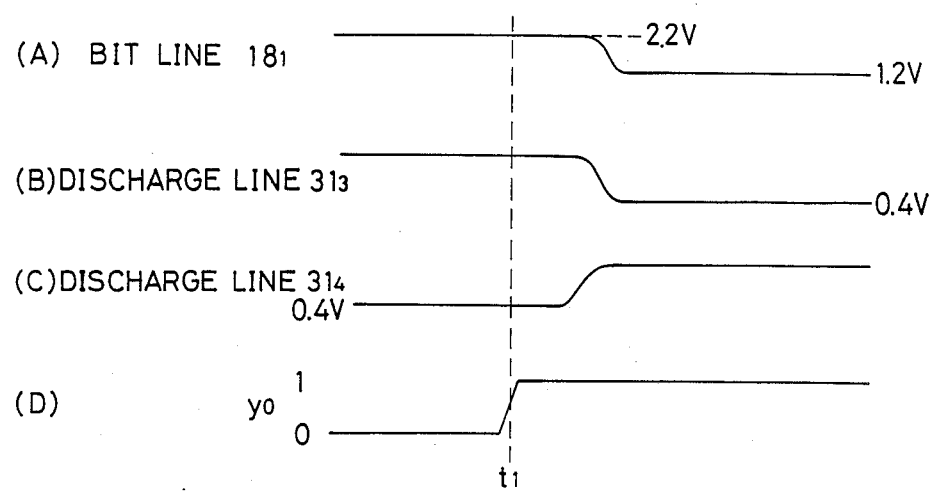
FIGS. 8(A) through 8(D) show signal waveforms at different parts in the circuit shown in FIG. 6.

FIG. 7A is a plan view of the embodiment having the circuit configuration of FIG. 6, and FIG. 7B is a cross sectional view taken along a line $VII_B$—$VII_B$ in FIG. 7A. The line $VII_B$—$VII_B$ corresponds to the discharge line $31_4$ shown in FIG. 6. In FIGS. 7A and 7B, constitutes having functions which are the same as functions of the constitutes shown in FIGS. 3A and 3B are denoted by the same references. A reference numeral 40 denotes a pattern which is added to the pattern shown in FIG. 3A according to the present embodiment. An area 41 within the pattern 40 is used for forming inverters $DC_1$ through $DC_4$ in the discharge circuit 30. The other area within the pattern 40 is used for forming the diodes connected between the discharge lines $31_1$ to $31_4$ and the bit lines $18_1$ and $18_4$. As shown in FIG. 6, no diode is connected between the discharge line $31_4$ and the bit line $18_1$. Therefore, as shown in FIG. 7B, the $n^-$-type layer $22_1$ has no diffusion region such as the layer $24_1$ shown in FIG. 3B. In addition, there is no contact hole on top of the layer $22_1$. A metallization film (not shown) forming the bit line $18_2$ is provided so as to cover a contact hole $51_3$, and a metallization film (also not shown) forming the discharge line $31_4$ is provided so as to cover a contact holes $51_1$ and $51_4$. A metallization film (not shown) forming the bit line $18_1$ is provided on the insulating film 26 above the $n^-$-type layer $22_1$.

In operation, when the address bits $y_0$ and $y_1$ having values of '0' and '1' respectively are supplied to the Y address circuit 14, the cell $S_{11}$ in which a datum has not been written is selected. In response to this address supply, only the AND circuit $DE_1$ is switched to the H-level (approximately 2.2 volts), and the bit line $18_1$ is precharged via a resistor $R_1$ provided in the multiplex circuit 17. As a result, the potential of the bit line $18_1$ is kept at the H-level as shown in FIG. 8(A). At this time, the output terminals of the inverter circuits 14a and 14d are at the H-level, and the output terminals of the inverter circuits 14b and 14c are at the L-level. Therefore, the discharge lines $31_1$ and $31_4$ in the discharge circuit 30 are switched to the L-level, and then the bit lines $18_2$ to $18_4$ are discharged via the diodes $D_{13}$, $D_{14}$, $D_{42}$ and $D_{44}$, respectively. As a result, the potentials of the bit lines $18_2$ to $18_4$ become equal to be approximately 1.2 volts due to the voltage drop across the resistor $R_1$. The L-level of the bit lines is of a potential of 1.2 volts (discharged level). Since the discharge lines $31_2$ and $31_3$ are at the H-level, the bit line $18_1$ coupled with the selected cell $S_{11}$ is maintained at the H-level (equal to approximately 2.2 volts). Signal waveforms on the discharge lines $31_3$ and $31_4$ are shown in FIGS. 8B and 8C, respectively. FIG. 8D shows a waveform of the address bit $y_0$.

Subsequently, when the value of the address bit $y_0$ is changed to '1' at time $t_1$ and thereby the cell $S_{13}$ is selected, the outputs of the AND circuit $DE_1$ and $DE_3$ are changed to the L and H-levels, respectively, and thus the bit line $18_3$ is precharged. Simultaneously, the discharge lines $31_1$ and $31_2$ are switched to the L and H-levels, respectively. Therefore the bit lines $18_1$, $18_2$ and $18_4$ are discharged and become equal to be discharge potential of approximately 1.2 volts. Similarly, when the cell $S_{12}$ is selected, all the bit lines except for the bit line $18_2$ are forced to be discharged. And when the cell $S_{14}$ is selected, all the bit lines except for the bit line $18_4$ are forced to be discharged.

Figure 9:
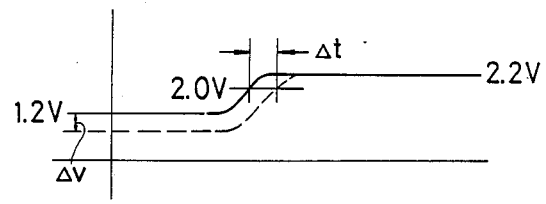
FIG. 9 is a view for explaining delay of the rising of a signal obtained in the circuit of FIG. 6.

The potentials of the bit lines $18_1$ to $18_4$ which have been discharged by the function of the discharge lines $31_1$ to $31_4$ are equal to be approximately 1.2 volts which is the potential value of the bit line $18_1$ which has been switched to the L-level when the cell in which information has been written as in the cell $S_{21}$ is selected. The reason for the above is as follows. As shown in FIG. 9, a time necessary for the potential of the bit lines to rise from a value of $(1.2-\Delta)$ volts to 2.2 volts is $\Delta t$ longer than a time necessary for the potential of the bit lines to rise from a value of 1.2 volts to 2.2 volts. The precharged potential of the bit lines at approximately 1.2 volts enables the rise of the signal waveform on each bit line to be prevented from being delayed.

As described above, since all the bit lines except for the bit line to which the cell selected by the discharge circuit 30 is connected are forced to be discharged, the number of the cells which have written information and conduct temporarily due to the address skew is one at most. Therefore the delay of the signal is very small and speeding up of information read from the ROM becomes possible.

The area 40 which is added to the pattern shown in FIG. 3A does not lead to a considerable increase in the pattern area on the chip. The number of the discharge line depends on the number of bits of the Y address. For example, in the embodiment of FIG. 6, the four discharge lines $31_1$ and $31_4$ are provided as the Y address consists of two bits $y_0$ and $y_1$. In general, in a case where the Y address consists of m bits, $(2\times m)$ discharge lines are necessary to configure the discharge circuit. Likewise, $(2\times m)$ inverters are necessary to designate the levels of the discharge line.

Figure 10:
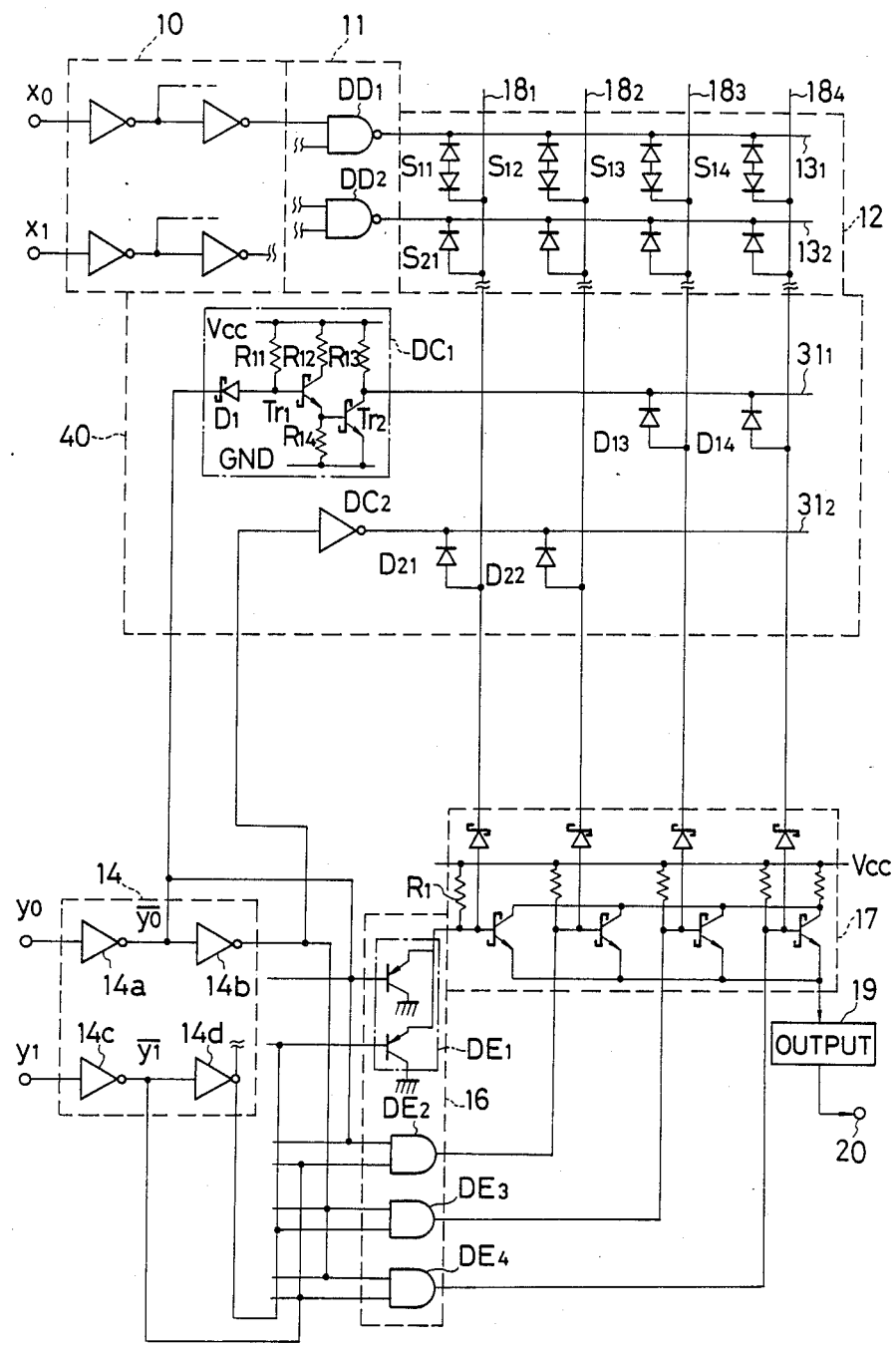
FIG. 10 is a circuit diagram of another embodiment of the present invention.

FIG. 10 is a circuit diagram of another embodiment of the present invention. The reference numerals which are the same as those in FIG. 6 denote the constituents which are the same as those therein.

A discharge circuit 40 comprises inverters $DC_1$ and $DC_2$, discharge lines $31_1$ and $31_2$, and diodes $D_{13}$, $D_{14}$, $D_{21}$ and $D_{22}$. The input terminal of the discharge circuit $DC_1$ is connected to the output terminal of the inverter 14a, and the input terminal of the discharge circuit $DC_2$ is connected to the output terminal of the inverter 14b. The output terminals of the inverters $DC_1$ and $DC_2$ are connected to the discharge lines $31_1$ and $31_2$, respectively. The diodes $D_{13}$ and $D_{14}$ connect the bit lines $18_3$ and $18_4$ to the discharge line $31_1$, respectively. The diodes $D_{21}$ and $D_{22}$ connect the bit lines $18_1$ and $18_2$ to the discharge line $31_2$. Positions at which diodes are to be connected between the discharge lines and bit lines are selected as in the case of the embodiment shown in FIG. 6.

In the embodiment of FIG. 9, when the address bit $y_0$ is set to '0' and thereby a cell connected to the bit line $18_1$ or $18_2$ is selected, the bit lines $18_3$ and $18_4$ are discharged by the discharge line $31_1$. When the address bit $y_0$ is set to '1' and thereby a cell connected to the bit line $18_3$ or $18_4$ is selected, the bit lines $18_1$ and $18_2$ are discharged by the discharge line $31_2$.

In this case, cells which have written information and conduct temporarily due to the occurrence of the address skew is equal to n/2 at most where n is the number of cells connected to one word line. Therefore, cells having the probability of conducting temporarily due to the address skew are decreased compared to the conventional ROM shown in FIG. 1. As a result, the delay of the signal is also decreased, so that the speed of reading out information from the designated cell is improved compared to the conventional ROM. Further the circuit configuration of the ROM shown in FIG. 9 is simplified and is thereby capable of decreasing an area on the semiconductor chip occupied by the discharge circuit, compared to the first embodiment shown in FIG. 6. However, the ROM of FIG. 6 is faster than the ROM of FIG. 9.

In the above embodiment of FIG. 9, the discharge circuit 40 is activated by the address bit $y_0$ and its reverse bit. It is possible to activate the discharge circuit 40 by using a plurality of bits selected from among the bits $y_0$ to $y_m$ of the Y address as well as their reverse bits.

The present invention is not limited to the above embodiments, but various variations and modifications may be made without departing from the scope of the present invention.

What is claimed is:

1. A read only memory circuit comprising:
a memory cell array having a plurality of bit lines, a plurality of word lines and cells connected between the bit lines and word lines;
bit line selecting means operably coupled to said memory cell array for selecting one of the bit lines designated by a Y address and for precharging the selected bit line at a precharged potential;
word line selecting means operably coupled to said memory cell array for selecting one of the word lines by an X address;
signal output means operably connected to said plurality of cells for extracting a datum stored in one cell connected between said one bit line and said one word line designated by the supply of the X and Y addresses; and
discharge means having discharge lines respectively connected to said plurality of bit lines for discharging all the bit lines except for said one bit line designated by the Y address to thereby preclude delay in a signal rise in said one bit line selected by said bit line selecting means having said precharged potential.

2. A read only memory circuit as claimed in claim 1, wherein the discharge means comprises a plurality of discharge lines, level setting means for setting the level of each of the discharge lines at one of low and high levels in accordance with the Y address, and diodes being connected between discharge lines and bit lines in accordance with a criterion that all the bit lines except for said one designated bit line are connected to related discharged lines set at the low level via the diodes and are thereby discharged.

3. A read only memory circuit as claimed in claim 2, wherein an anode terminal of each of the diodes is connected to the related bit line, and a cathode terminal thereof is connected to the related discharge line.

4. A read only memory circuit as claimed in claim 2, wherein each of the X and Y addresses is composed of a plurality of address bits, and the level setting means comprises inverters each connected to the respective discharge lines, and wherein each of the inverters is provided with one of predetermined address bits of the Y address and inverted address bits thereof.

5. A read only memory circuit as claimed in claim 4, wherein when one address bit supplied to the related inverter is kept at the high level and thereby the discharge line connected to said related inverter is kept at the low level, bit lines without being selected by said one address bit at the high level are discharged by said discharge line kept at the low level through the diodes.

6. A read only memory circuit as claimed in claim 4, wherein when the Y address consists of m bits, $(2\times m)$ discharge lines are provided.

7. A read only memory circuit as claimed in claim 2, wherein each of the inverters comprises two series connected Schottky transistors.

8. A read only memory circuit as claimed in claim 1, wherein the read only memory circuit is a programmable read only memory circuit.

9. A read only memory circuit comprising:
a memory cell array having a plurality of bit lines, a plurality of word lines and cells connected between the bit lines and word lines;
bit line selecting means operably coupled to said memory cell array for selecting one of the bit lines designated by a Y address and for precharging the selected bit line at a precharged potential level;
word line selecting means operably coupled to said memory cell array for selecting one of the word lines by an X address;
signal output means operably connected to said plurality of cells for extracting a datum stored in one cell connected between said one bit line and said one word line designated by the supply of the X and Y addresses; and
discharge means having discharge lines respectively connected to said plurality of bit lines for discharging a part of all the bit lines except for said one bit line designated by the Y address to thereby preclude delay in a signal rise in said one bit line selected by said bit line selecting means having said 10. A read only memory circuit as claimed in claim 9, wherein the discharge means comprises a plurality of discharge lines, level setting means for setting the potential level of each of the discharge lines at one of low and high levels in accordance with the Y address, and diodes being connected between discharge lines and bit lines in accordance with a criterion that the part of all the bit lines except for said one designated bit line is connected to related discharge lines set at the low level via the diodes and are thereby discharged.

11. A read only memory circuit as claimed in claim 10, wherein an anode terminal of each of the diodes is connected to the related bit line, and a cathode terminal thereof is connected to the related discharge line.

12. A read only memory circuit as claimed in claim 10, wherein each of the X and Y addresses is composed of a plurality of address bits, and the level setting means comprises inverters each connected to the respective discharge lines, and wherein each of the inverters is provided with one of predetermined address bits of the Y address and inverted address bits thereof.

13. A read only memory circuit as claimed in claim 12, wherein when one address bit of the Y address supplied to the related inverter is kept at the high level and thereby the discharge line connected to said related inverter is kept at the low level, bit lines without being selected by said one address bit at the high level are discharged by said discharge line kept at the low level through the diodes.

14. A read only memory circuit as claimed in claim 12, wherein when the Y address consists of m bits, (2×m) discharge lines are provided.

15. A read only memory circuit as claimed in claim 10, wherein each of the inverters comprises two series connected Schottky transistors.

16. A read only memory circuit as claimed in claim 10, wherein the read only memory circuit is a programmable read only memory circuit.

17. A read only memory circuit comprising:
a memory cell array having a plurality of bit lines, a plurality of word lines and cells connected between the bit lines and word lines;
bit line selecting means operably coupled to said memory cell array for selecting one of the bit lines designated by a Y address and for precharging the selected bit line at a precharged potential;
word line selecting means operably coupled to said memory cell array for selecting one of the word lines by an X address;
signal output means operably connected to said plurality of cells for extracting a datum stored in one cell connected between said one bit line and said one word line designated by the supply of the X and Y addresses; and
discharge means having discharge lines respectively connected to said plurality of bit lines for discharging all the bit lines except for said one bit line designated by the Y address to thereby preclude delay in a signal rise in said one bit line selected by said bit line selecting means having said precharged potential, wherein said discharge means further includes level setting means operably connected to said discharge lines for setting the level of each of said discharge lines in at least one of a high level and a low level in accordance with said Y address, and diodes connected between said discharge lines and bit lines in accordance with a criterion that all of said bit lines, except for said one designated bit line, are connected to discharge lines which are set at said low level by said diodes and are thereby discharged.

18. A read only memory circuit comprising:
a memory cell array having a plurality of bit lines, a plurality of word lines and cells connected between the bit lines and word lines;
bit line selecting means operably coupled to said memory cell array for selecting one of the bit lines designated by a Y address and for precharging the selected bit line at a precharged potential level;
word line selecting means operably coupled to said memory cell array for selecting one of the word lines by an X address;
signal output means operably connected to said plurality of cells for extracting a datum stored in one cell connected between said one bit line and said one word line designated by the supply of the X and Y addresses; and
discharge means having discharge lines respectively connected to said plurality of bit lines for discharging a part of all the bit lines except for said one bit line designated by the Y address to thereby preclude delay in a signal rise in said one bit line selected by said bit line selecting means having said precharged potential, wherein said discharge means further includes level setting means operably connected to said discharge lines for setting the potential level of each of said discharge lines in at least one of a high level and a low level in accordance with said Y address, and diodes connected between said discharge lines and bit lines in accordance with a criterion that a part of all of said bit lines, except for said one designated bit line, is connected to discharge lines which are set at said low level by said diodes and are thereby discharged.

* * * * *